United States Patent
Erez et al.

(10) Patent No.: US 6,190,103 B1
(45) Date of Patent: Feb. 20, 2001

(54) WAFER TRANSFER DEVICE AND METHOD

(75) Inventors: Shmuel Erez, San Jose; Syed S. Basha, Pleasanton; Art Hajjarian, Los Altos, all of CA (US)

(73) Assignee: GaSonics International Corporation, San Jose, CA (US)

(*) Notice: Under 35 U.S.C. 154(b), the term of this patent shall be extended for 0 days.

(21) Appl. No.: 09/282,525

(22) Filed: Mar. 31, 1999

(51) Int. Cl.$^7$ .................................................. B65G 49/07

(52) U.S. Cl. ............... 414/217; 414/222.07; 414/222.08; 414/222.13; 414/226.02; 414/939; 414/941; 294/106

(58) Field of Search ......................... 414/222.07, 222.08, 414/222.13, 226.02, 226.05, 217, 774.2, 939, 941; 294/106

(56) References Cited

U.S. PATENT DOCUMENTS

| | | | |
|---|---|---|---|
| 3,841,689 | * 10/1974 | Hurlbrink, III | 294/106 X |
| 3,887,084 | * 6/1975 | Gallo et al. | 414/744.2 |
| 4,501,527 | * 2/1985 | Jacoby et al. | 414/222.13 |
| 5,100,285 | * 3/1992 | Wagner | 414/222.13 X |
| 5,292,393 | 3/1994 | Maydan et al. . | |
| 5,569,014 | 10/1996 | Hofmeister . | |
| 5,570,994 | * 11/1996 | Somekh et al. | 414/941 X |
| 5,655,060 | 8/1997 | Lucas . | |
| 5,700,046 | * 12/1997 | Van Doren et al. | 414/941 X |
| 5,863,170 | 1/1999 | Boitnott et al. . | |
| 5,935,330 | * 8/1999 | Taniguchi | 414/222.07 X |

FOREIGN PATENT DOCUMENTS

91/18414 * 11/1991 (WO) .

* cited by examiner

Primary Examiner—Steven A. Bratlie
(74) Attorney, Agent, or Firm—Townsend and Townsend and Crew LLP

(57) ABSTRACT

A substrate handling apparatus includes a transfer elevator and a process station disposed inside a load lock chamber. The process station includes a top module, a bottom module, and a seal ring which is disposed between the top module and the bottom module and is movable to open and close the process station. The transfer elevator has an upper station spaced above a lower station. A transfer device having a pair of transfer arms is used to transfer substrates between the transfer elevator and the process station. The transfer arms are movable toward one another to support a substrate and apart from one another to release the substrate. The transfer arms are mounted to rotate between the transfer elevator and the process station. When a substrate is being processed inside the process station, the transfer arms are disposed on opposite sides of the process station. Upon completion of processing the substrate, the seal ring is opened, and the transfer arms move between the top module and seal ring to grasp the processed substrate and transfer it to the lower station of the transfer elevator (or upper station as desired) by simple rotation. The transfer arms are moved apart to release the processed substrate onto the lower station. The transfer elevator is lowered to align a fresh substrate disposed on the upper station with the transfer arms, which are moved toward one another to grasp the fresh substrate and transfer it to the process station by rotation. The transfer arms are then moved apart to release the fresh substrate into the process station. The seal ring of the process station is closed to seal the top and bottom modules together for processing the fresh substrate disposed therein.

59 Claims, 10 Drawing Sheets

WAFER TRANSFER DEVICE AND METHOD

BACKGROUND OF THE INVENTION

This invention relates to handling of substrates and, more particularly, to a load lock apparatus and methods for transferring substrates in semiconductor or flat panel manufacturing or the like.

Substrate handling apparatus such as load lock devices are commonly used for transferring substrates such as wafers or flat panels for carrying out various processes. As used herein, the term "substrate" refers to a wafer, flat panel, or the like. Multi-link mechanisms such as those disclosed in U.S. Pat. Nos. 5,292,303, 5,569,014, and 5,655,060 are commonly used in moving substrates. Such multi-link mechanisms typically are complex and require a substantial amount of room to operate. They also employ multiple axes of rotation for the various linkage members, and tend to suffer from vibrations or other mechanical instabilities, leading to difficulties in precise displacements or necessitating slow movements to achieve accurate positioning of the wafers.

SUMMARY OF THE INVENTION

The present invention provides wafer handling apparatus and methods that overcome the shortcomings of the prior art. It does so by eliminating complex mechanisms such as multi-link structures. In specific embodiments, the wafer handling apparatus employs a pair of transfer arms that are mounted to rotate about a single axis of rotation for supporting a substrate and moving it between stations. The transfer arms are sturdy and involve simple, quick rotations to handle and transfer substrates. The simple mechanism provides stable transfer and accurate positioning of substrates, and requires small displacements and relatively little space to operate.

In accordance with an embodiment of the present invention, a substrate handling apparatus comprises a load lock chamber having a port for transferring substrates in and out of the load lock chamber. A transfer elevator is disposed inside the load lock chamber. The transfer elevator has an upper station with an upper elevator spacing thereabove and a lower station disposed generally below the upper station. The lower station is spaced from the upper station by a lower elevator spacing. The transfer elevator is movable between an up position to generally align the lower station with the port of the load lock chamber and a down position to generally align the upper station with the port of the load lock chamber. A process station is disposed inside the load lock chamber, and has a first portion and a second portion. At least one of the first portion and the second portion is movable relative to the other of the first portion and the second portion between an open position and a closed position. The first portion and the second portion are coupled with each other in the closed position and are separated from each other in the open position by a process station spacing. A transfer device is disposed inside the load lock chamber. The transfer device includes a pair of transfer arms which define an open space therebetween and are movable between the transfer elevator at least partially through one of the upper and lower elevator spacings and the process station at least partially through the process station spacing. The transfer arms are movable relative to each other between a support position and a release position. The transfer arms move toward each other to decrease the size of the open space therebetween in the support position to contact a substrate to support the substrate and move apart from each other to increase the size of the open space therebetween in the release position to release the substrate. The open space between the transfer arms is sufficiently large in the release position to allow movement of at least one of the first portion and the second portion of the process station between the open position and the closed position when the process station is disposed in the open space between the pair of transfer arms.

In accordance with another embodiment of the invention, a substrate handling apparatus comprises a load lock chamber and a transfer station disposed inside the load lock chamber. A process station and a pair of transfer arms are disposed inside the load lock chamber. The apparatus includes means for rotating the pair of transfer arms between the transfer station and the process station substantially along a plane to transfer a substrate between the transfer station and the process station. The apparatus further includes means for moving the pair of transfer arms toward each other substantially along the plane to contact the substrate to support the substrate and moving the pair of transfer arms apart from each other to release the substrate.

Another embodiment of this invention is directed to a device for transferring a wafer between a transfer station and a process station having a first portion and a second portion which are coupled with each other in a closed position and which are spaced from each other by a process station spacing in an open position. The device comprises a pair of transfer arms defining an open space therebetween and being pivotable to rotate between the transfer station and the process station at least partially through the process station spacing between the first and second portions of the process station. A mechanism coupling the pair of transfer arms is provided to adjust the size of the open space. The mechanism decreases the size of the open space to contact the wafer with the pair of transfer arms for supporting the wafer and increases the size of the open space to release the wafer.

Yet another embodiment of the present invention is directed to a method for transferring substrates for processing in a process station having a first portion and a second portion which are coupled with each other in a closed position and which are spaced from each other in an open position by a process station spacing. The method comprises providing a first substrate on a first substrate support of a transfer station, and contacting the first substrate with a pair of transfer arms to support the first substrate between the pair of transfer arms by decreasing the size of an open space between the pair of transfer arms. The first substrate support of the transfer station is separated from the first substrate. The pair of transfer arms are moved to the process station to position the first substrate in the process station spacing between the first portion and the second portion. The first substrate is released from the pair of transfer arms into the process station by increasing the size of the open space between the pair of transfer arms. The first portion and the second portion of the process station are closed for processing the first substrate in the process station in the closed position which is disposed in the open space between the pair of transfer arms.

DESCRIPTION OF THE SPECIFIC EMBODIMENTS

Figure 1:
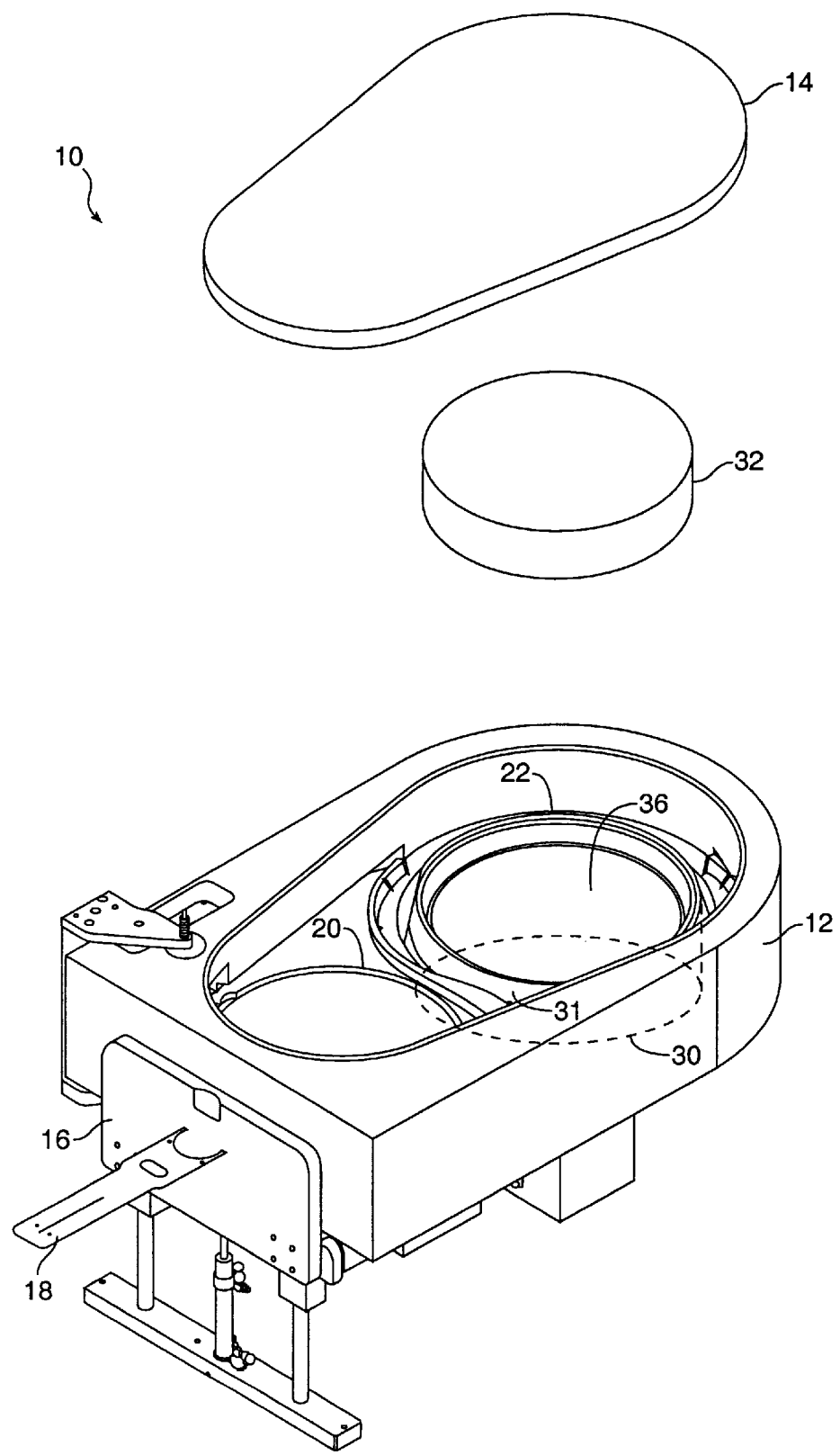
FIG. 1 is an exploded perspective view of a load lock apparatus according to an embodiment of the present invention.
Figure 2:
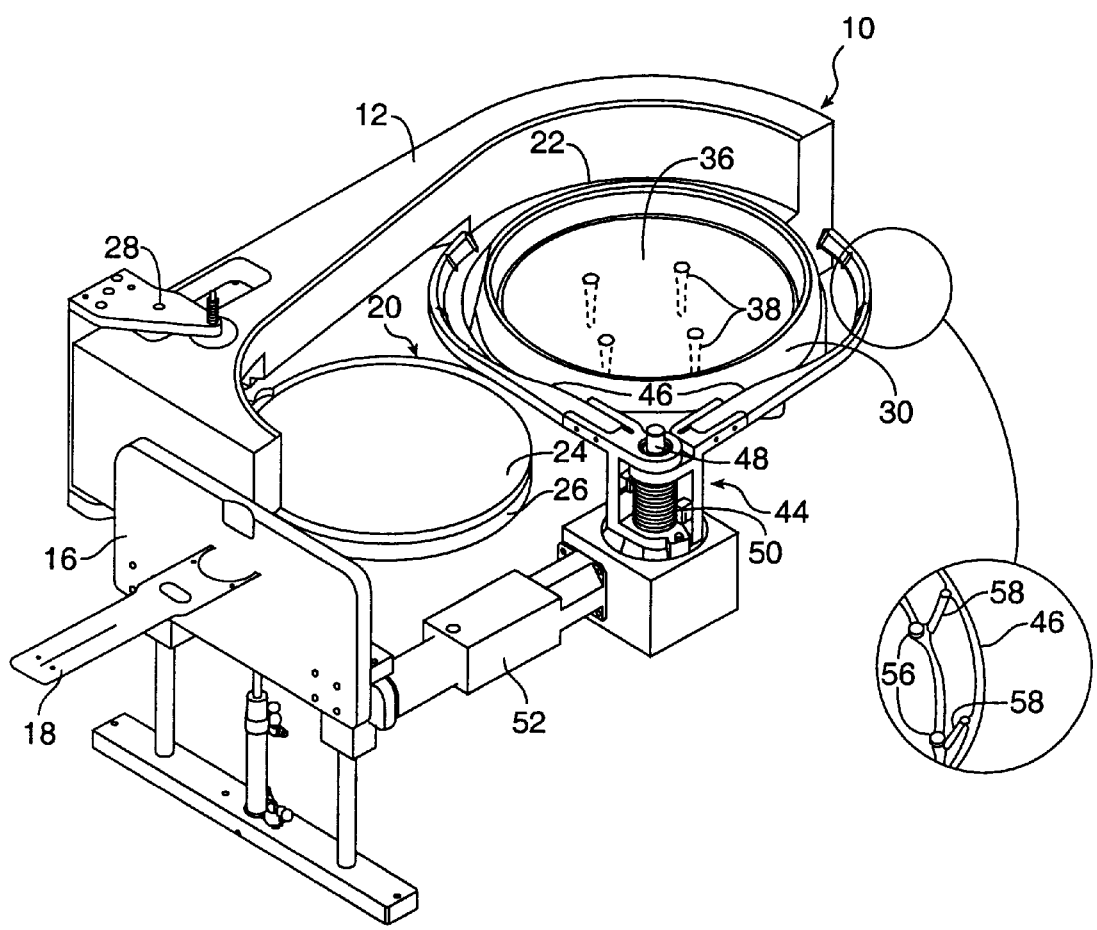
FIG. 2 is a perspective view of the load lock apparatus of FIG. 1 with the front portion of the load lock chamber removed to show the interior.

FIGS. 1 and 2 show a load lock apparatus including a load lock chamber 10 having a chamber body 12 and a chamber cover 14. The chamber body 12 has an opening or port covered by a chamber door 16 which is operable to allow transfer of wafers into and out of the chamber 10 by a robot arm 18. The load lock chamber 10 is typically a vacuum chamber having a vacuum valve which is coupled to a vacuum source. In such an embodiment, the chamber door 16 separates the vacuum interior of the chamber 10 from the external atmosphere.

As better shown in FIG. 2, a transfer station 20 and a process station 22 are disposed adjacent one another inside the load lock chamber 10. As used herein, the term "inside the load lock chamber" denotes physical disposition only. The process station 22 when closed typically provides an environment for processing which is different from the environment provided in the load lock chamber 10, even though the process station 22 is physically disposed inside the chamber 10. The transfer station 20 in the embodiment shown includes an upper station 24 and a lower station 26. An elevator actuator 28 (which are better seen in FIGS. 5 and 6) is operable to move the upper and lower stations 24, 26 generally vertically up and down. In a specific embodiment, the upper and lower stations 24, 26 are coupled to move up and down together by a single actuator 28. The upper station 24 is spaced above the lower station 26 by a sufficient amount to allow easy and unobstructed transfer of substrates into and out of the lower station 26. The spacing between the upper station 24 and the lower station 26 is preferably small to keep the size of the load lock chamber 10 to a minimum. In one example, the spacing is about 20 mm. Of course, the spacing can be smaller or larger depending on the desired clearance.

The process station 22 includes a bottom module 30, a seal ring 31, and a matching top module 32 which is sealed to the bottom module 30 by the seal ring 31 to form an enclosed chamber in a closed position, and is separated from the bottom module 30 and seal ring 31 by a process station spacing to allow transfer of a wafer into or out of the process station 22 in an open position. The process station 22 is similar to those disclosed in U.S. Pat. No. 5,863,170, which is incorporated herein by reference in its entirety. Typically the bottom module 30 and top module 32 are stationary while the seal ring 31 is movable to open and close the process station 22. In this embodiment, the seal ring 31 is movable by a process station actuator downward to the open position and upward to the closed position. Inside the process station 22 is a platen 36 for supporting a substrate and a set of lift pins 38 which are operable by a lift pin actuator to move upward to lift the substrate from the platen 38 and to move downward to lower the substrate onto the platen 38. Lift pin mechanisms are well-known in the art. In an alternate embodiment, support pins rather than the platen 36 may be used to support the substrate or the lift pins 38 are used both for supporting the substrate and for lifting and lowering the substrate.

A transfer mechanism 44 is disposed inside the load lock chamber 10 for transferring substrates between the transfer station 20 and the process station 22. As best seen in FIG. 2, the transfer mechanism 44 includes a pair of transfer arms 46 which are mounted to a pivot or axis of rotation 48 to rotate between the transfer station 20 and the process station 22. In the embodiment shown, the transfer arms 46 are coupled to a yoke 50 which is actuatable to rotate the arms 46 together relative to the pivot 48 between the stations while maintaining a fixed open space between the arms 46. In this embodiment, the yoke 50 is actuated by a linear drive mechanism 52 to rotate the transfer arms 46 generally in a horizontal plane.

The transfer arms 46 desirably are curved with a curvature that substantially match that of the substrates. In the embodiment shown, each transfer arm 46 includes a bottom support for contacting and supporting a bottom portion of the substrate, and desirably also includes an edge contact for contacting an edge portion of the substrate. The transfer arms 46 preferably include bottom bolts or buttons 56 provided at the bottom support and side pins 58 provided at the edge contact for contacting the substrate. The side pins 58 preferably serve to align or center the substrate when they come into contact with the substrate. The bottom bolts 56 and side pins 58 are typically made of a clean, inert material such as sapphire, quartz, and ceramics. Although the transfer arms 46 can also be made of sapphire or quartz or the like, they are typically made of metal such as stainless steel or aluminum which is substantially less expensive than sapphire and quartz.

Figure 3:
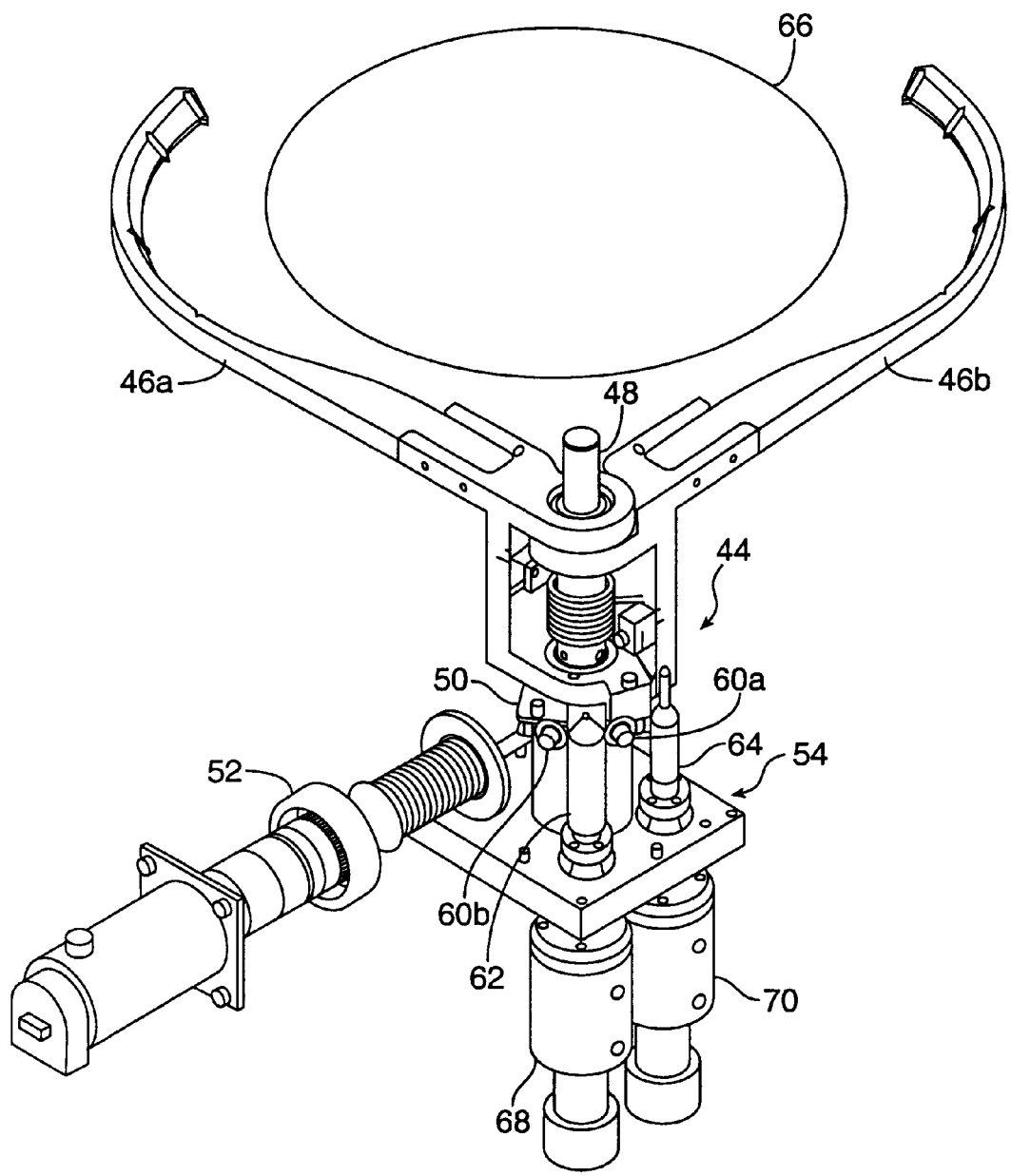
FIG. 3 is a perspective view of the transfer mechanism in the load lock apparatus of FIG. 2 illustrating the open/close mechanism in an open position according to an embodiment of the invention.
Figure 4:
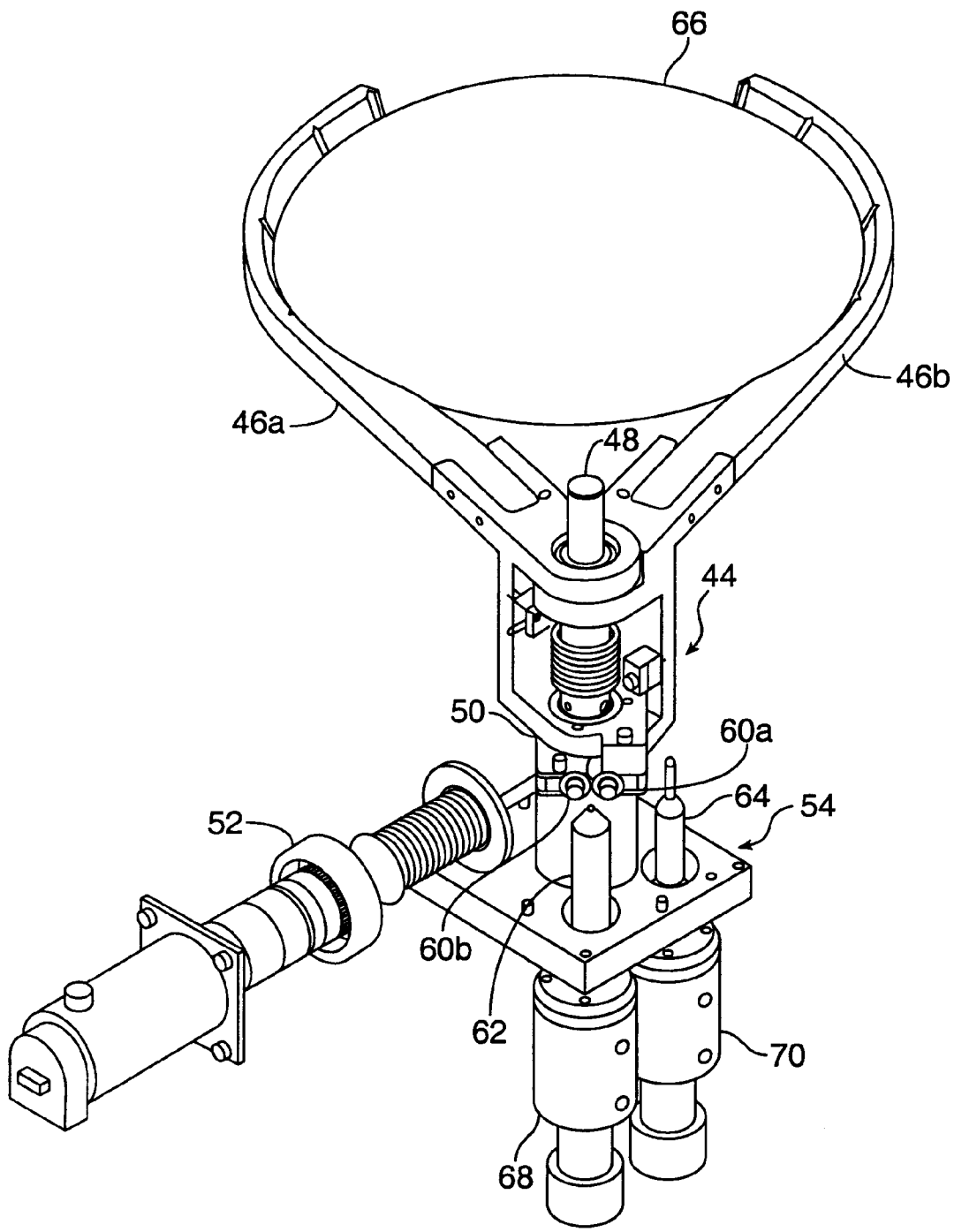
FIG. 4 is a perspective view of the transfer mechanism of FIG. 3 illustrating the open/close mechanism in a closed position.

The open space between the arms 46 is adjustable in size by an open/close mechanism 54 which is illustrated in FIG. 3 in an open or release position and in FIG. 4 in a closed or support position. The open/close mechanism 54 includes a pair of movable bearings 60a, 60b and a pair of movable shafts 62, 64 having cone-shaped heads. The first bearing 60a is coupled with one transfer arm 46a while the second bearing 60b is coupled with the other transfer arm 46b. The bearings 60a, 60b are configured to rotate relative to the pivot 48, and are normally biased by a spring or the like toward a closed position shown in FIG. 4, bringing the pair of transfer arms 46a, 46b closer to support a substrate 66. When the bearings 60a, 60b are pushed apart from one another in rotation with respect to the pivot 48, as shown in FIG. 3, the transfer arms 46a, 46b are rotated to the open position. In FIG. 3, the first movable shaft 62 is moved by a first shaft actuator 68 upward to push the bearings 60a, 60b apart via the cone-shaped head to release the substrate 66 into the process chamber 22. To rotate the transfer arms 46a, 46b from the process station 22 to the transfer station 20, the first shaft 62 is withdrawn to allow the arms 46a, 46b to return to the closed position to support the substrate 66. After the transfer arms 46a, 46b are rotated to the transfer station 20, the second movable shaft 64 can be moved by a second actuator 70 upward to push the bearings 60a, 60b apart via the cone-shaped head to rotate the arms 46a, 46b to the open position to release the substrate 66.

The second shaft 64 has a smaller cross-section than the first shaft 62 in this embodiment because the transfer arms 46a, 46b need to be opened wider at the process station 22 than at the transfer station 20 to allow the seal ring 31 of the process station 22 to open and close. For simplicity, the movable shafts 62, 64 are generally round and aligned generally vertically. Different shapes and orientations may be used in other embodiments. The shafts 62, 64 in the embodiment shown do not rotate with the transfer arms 46a, 46b, while the bearings 60a, 60b rotate with the transfer arms 46a, 46b. Alternatively, one shaft may be provided which rotates with the arms 46a, 46b and remain generally fixed in position relative to the bearings 60a, 60b. In such an embodiment, the one shaft can be used to move the bearings 60a, 60b between the open and closed position when the transfer arms 46a, 46b are at the process station 22 or transfer station 20 or any other position. Furthermore, other mechanisms for opening and closing the transfer arms 46a, 46b may be used. In addition, another embodiment may employ a different mechanism for supporting and releasing the substrate from the transfer arms 46a, 46b by adjusting the size of the open space therebetween without requiring the opening and closing of the arms 46a, 46b.

Figure 5:
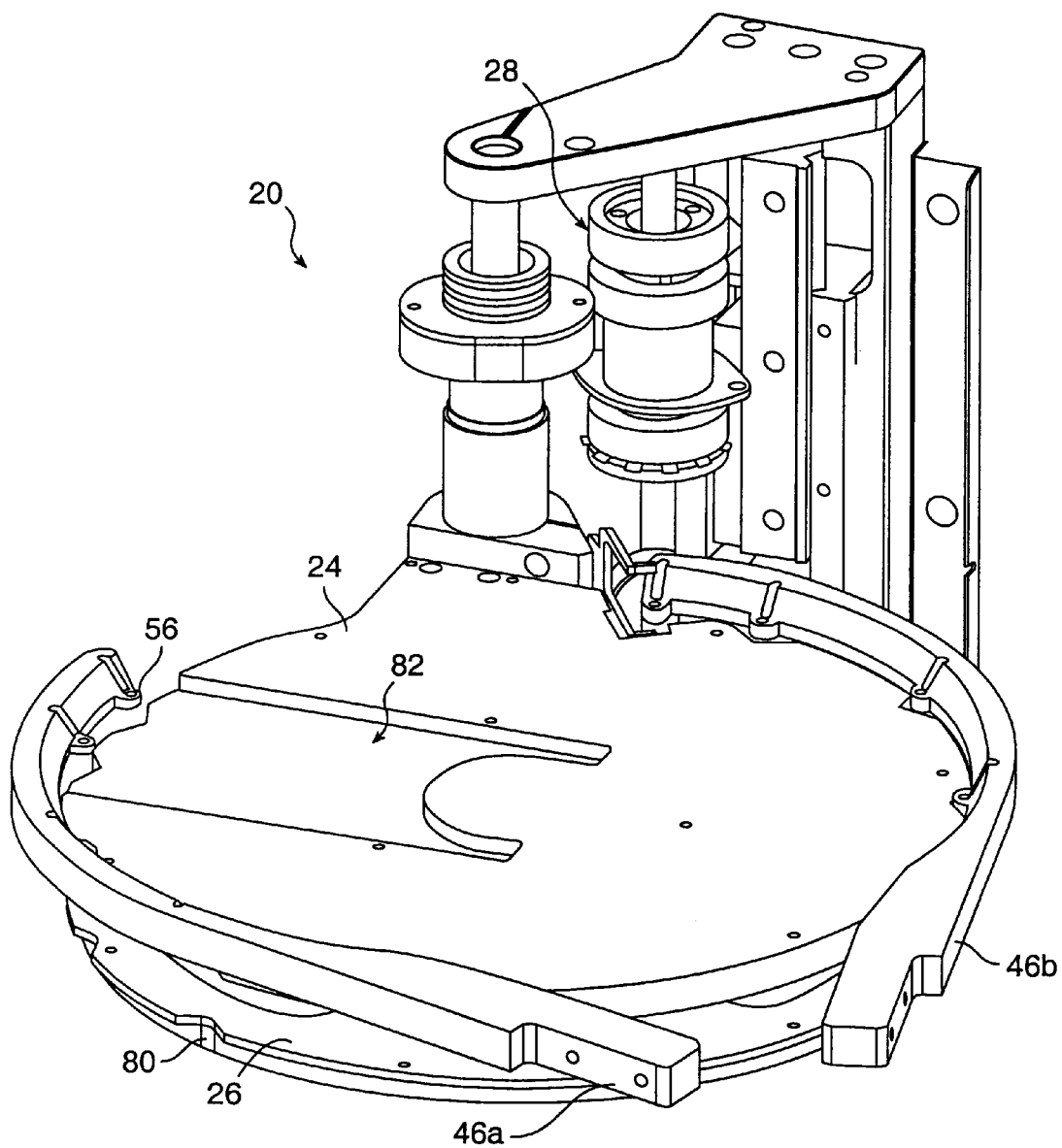
FIG. 5 is a perspective view of the transfer elevator in the load lock apparatus of FIG. 1.
Figure 6:
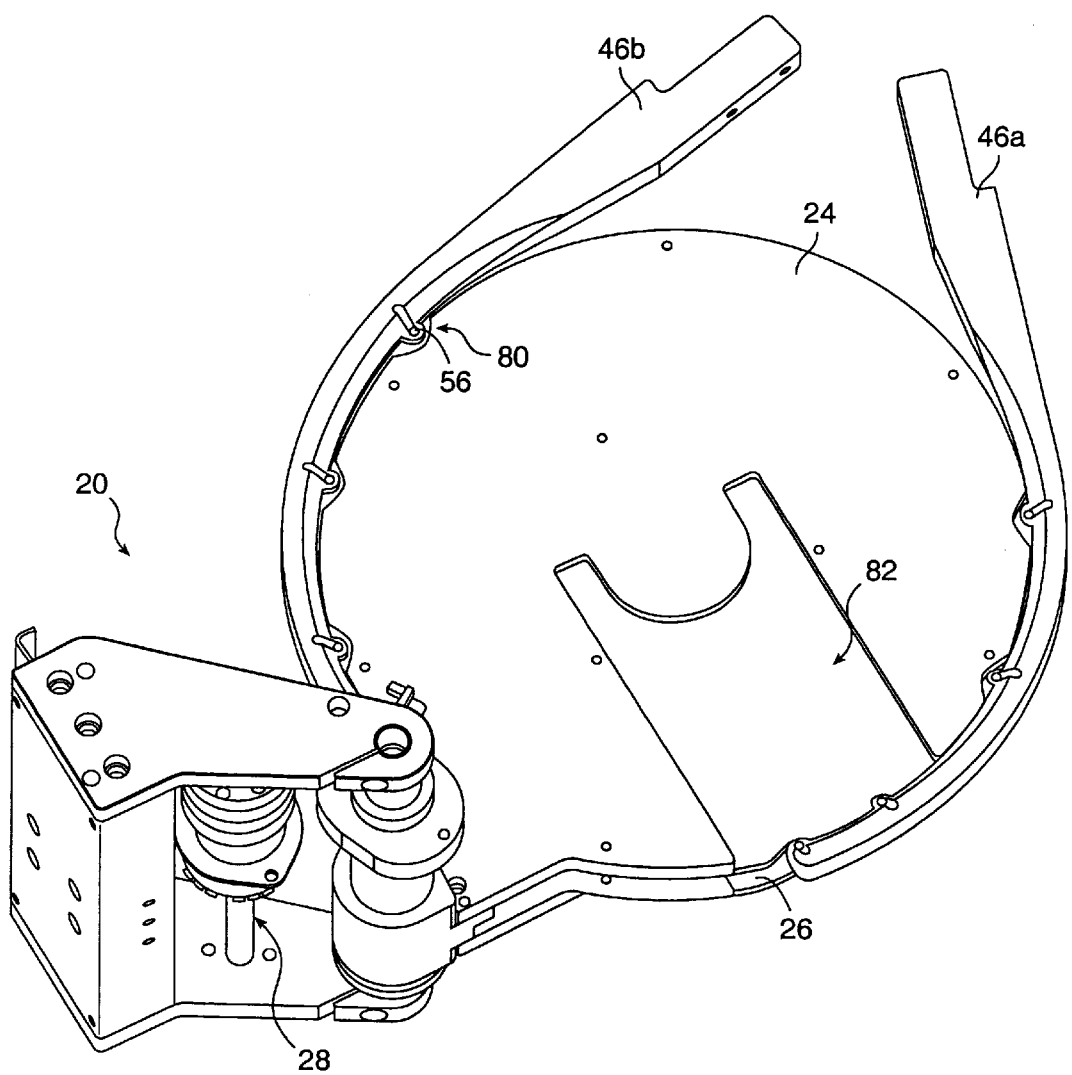
FIG. 6 is another perspective view of the transfer elevator in the load lock apparatus of FIG. 1.

The support surfaces of the upper and lower stations 24, 26 typically are circular in shape, and their diameters may be larger or smaller than or the same as those of the substrates being handled. If the diameters of the stations 24, 26 are smaller than the diameters of the substrates, the bottom bolts 56 of the transfer arms 46a, 46b can reach below the substrates to support the substrates. If the diameters of the stations 24, 26 are the same as or larger than the diameters of the substrates, notches 80 are provided along the edges of the stations 24, 26 to accommodate the bottom bolts 56, as illustrated in FIGS. 5 and 6. The edge notches 80 allow the bottom bolts 56 to reach below the substrates to support the substrates. An open cavity or channel 82 is also provided in the upper station 24 and lower station 26 (not shown) to accommodate the robot arm 18 and allow the robot arm 18 to reach below the substrates for supporting the substrates. In a specific example, the stations 24, 26 are configured for handling 300-mm substrates, and have diameters in the range of about 100–350 mm.

The process sequence of operating the load lock apparatus 10 is schematically illustrated in FIGS. 7a–7m. These figures demonstrate an example of a continuous process sequence. Beginning with FIG. 7a, the load lock chamber door 16 is opened to allow the robot arm 18 to transfer a fresh substrate 100 onto the lower station 26 of the transfer elevator 20 which is disposed in the upward position to generally align the lower station 26 with the opening of the chamber body 12. A processed substrate 102 which has already been processed in the process station 22 and removed therefrom is disposed on the upper station 24, for instance, to be cooled. Meanwhile, the process station 22 is closed to process another substrate 104 disposed inside. The transfer mechanism 44 is disposed at the process station 22 in the open position.

Figure 7A:
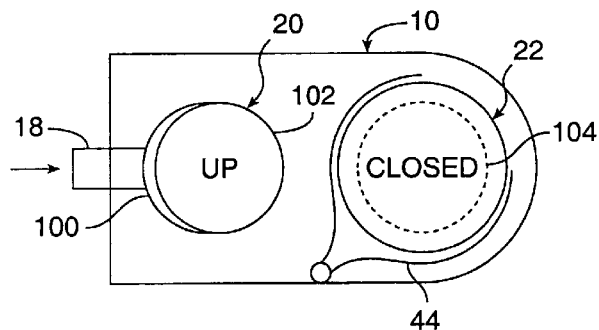
FIGS. 7a–7m are simplified top plan views of the load lock apparatus of FIG. 1 illustrating a sequence of positions for operating the apparatus in accordance with an embodiment of the invention.
Figure 7B:
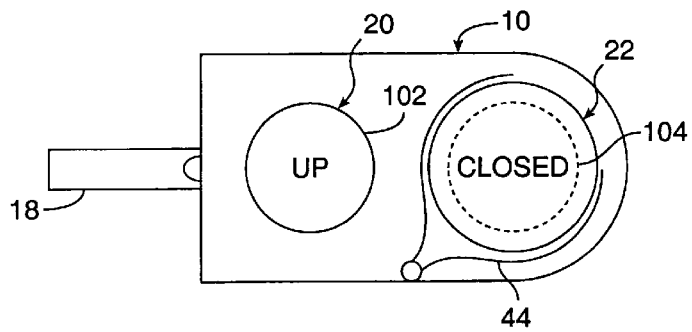
Figure 7C:
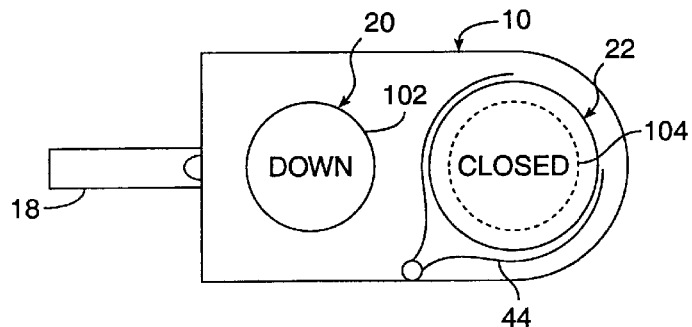
Figure 7D:
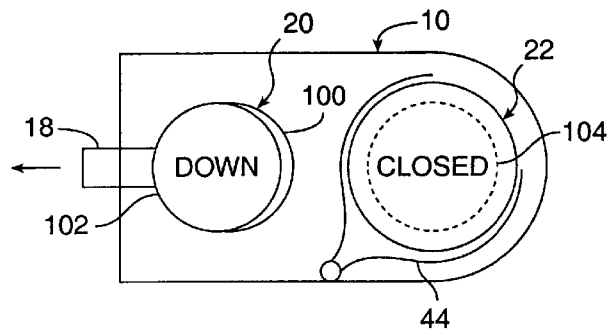
Figure 7E:
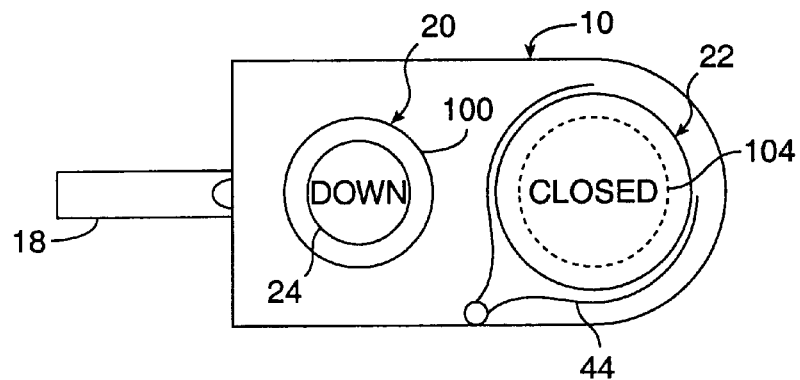

After the fresh substrate 100 is placed on the lower station 26 of the transfer elevator 20, the robot arm 18 is withdrawn in FIG. 7b to allow the transfer elevator 20 to move downward to align the upper station 24 with the robot arm 18 as shown in FIG. 7c. The robot arm 18 enters the chamber 10 again to pick up the processed substrate 102 from the upper station 24 as seen in FIG. 7d. In an alternative embodiment, the opening for the robot arm 18 is sufficiently large so that the robot arm 18 can be adjusted vertically to align with either the upper station 24 or the lower station 26 and move in and out of the chamber 10 without the need to adjust the transfer elevator 20 to align the upper station 24 with the robot arm 18 in FIG. 7c. Adjustment of the transfer elevator 20 is required only for internal swapping of substrates between the transfer elevator 20 and the process station 22, and not for transferring substrates in and out of the chamber 10 by the robot 18. In that case, the step in FIG. 7c can be eliminated or postponed. After the processed substrate 102 is retrieved from the chamber 10 as shown in FIG. 7e, the door 16 is closed. At this time, a vacuum valve is typically opened to equalize the pressure inside the load lock chamber 10 to that inside the process station 22.

Figure 7F:
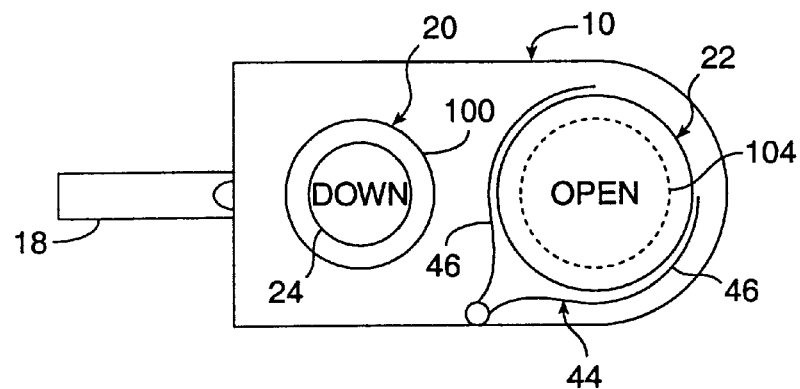
Figure 7G:
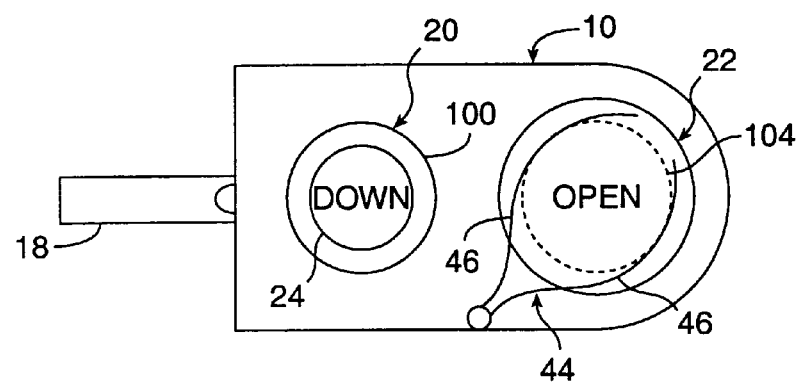
Figure 7H:
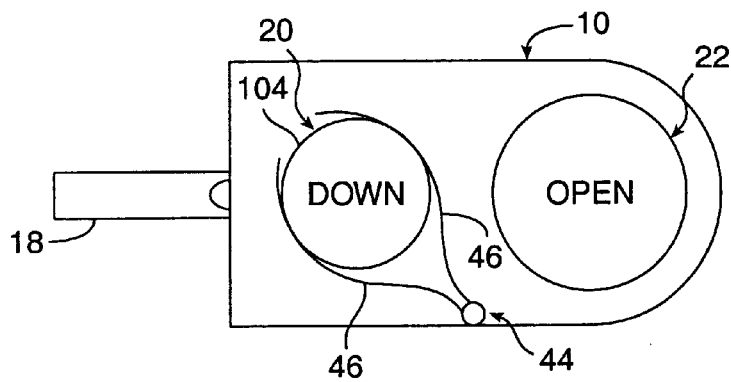
Figure 7I:
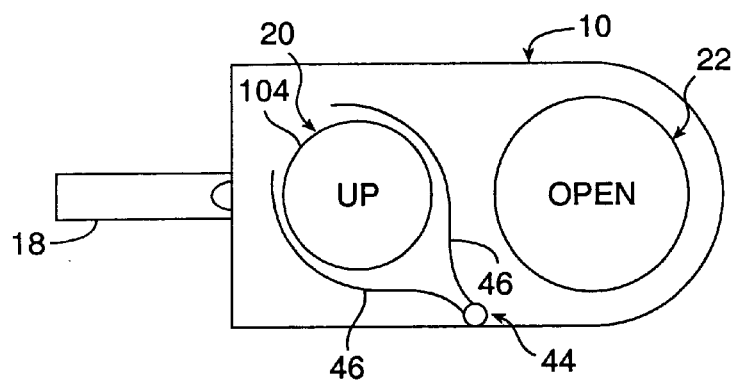
Figure 7J:
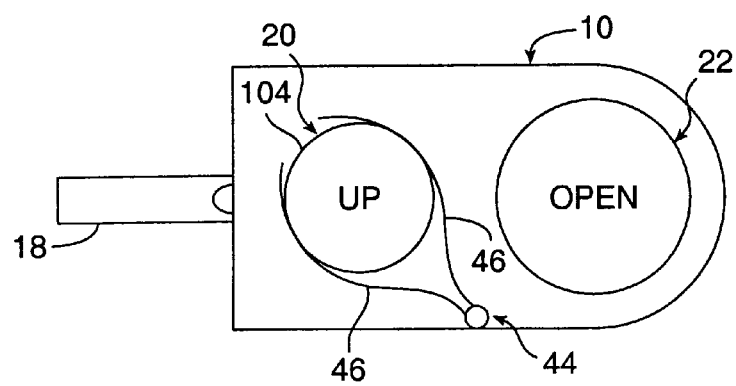
Figure 7K:
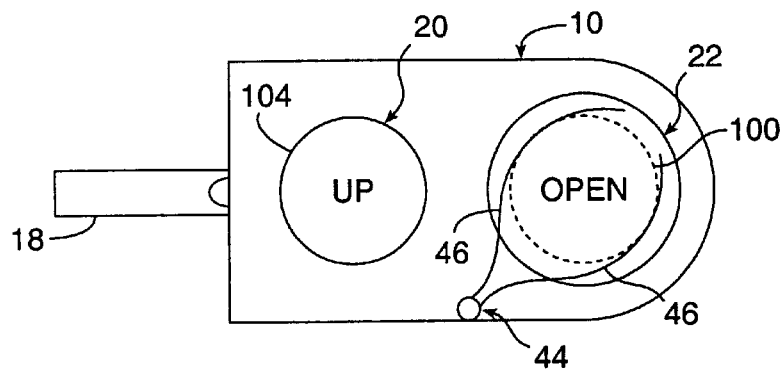
Figure 7L:
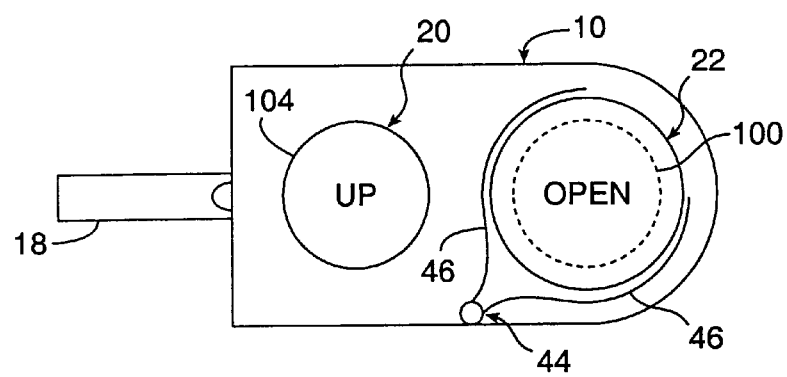
Figure 7M:
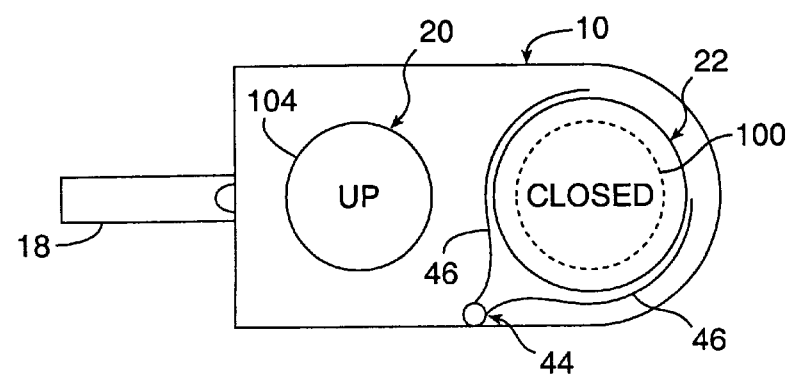

In FIG. 7f, the processing of the substrate 104 inside the process station 22 is complete and the seal ring 31 is moved downward from the top module 32 to open up the process chamber 22. The lift pins 38 are actuated to move the substrate 104 from the platen 36 to a level which coincides with the level of the transfer arms 46 of the transfer mechanism 44. The transfer arms 46 are moved to the support position to clasp the substrate 104 in FIG. 7g. The lift pins 38 are lowered to clear the way for rotation of the transfer arms 46 through the process station opening between the seal ring 31 and the top module 32 to the transfer station 20 as seen in FIG. 7h. At this point, the upper station 24 is spaced below the substrate 104. To place the substrate 104 on the upper station 24, the transfer elevator 20 moves the upper station 24 upward to contact the bottom of the substrate 104 and the transfer arms 46 are moved to the release position to release the substrate 104, as shown in FIG. 7i. The transfer elevator 20 continues to move upward until the fresh substrate 100 on the lower station 26 is generally aligned with the transfer arms 46. The transfer arms 46 are moved to the support position to clasp the fresh substrate 100 as seen in FIG. 7j. The transfer elevator 20 is moved downward slightly to release the fresh substrate 100 and to clear the way for the transfer arms 46 to move to the process station 22 by passing through the space between the upper station 24 and the lower station 26, as shown in FIG. 7k. The lift pins 38 are actuated to support the fresh substrate 100 and the transfer arms 46 are moved to the release position to release the fresh substrate 100 in FIG. 7l. The seal ring 31 is moved upward to close the process station 22 for processing the substrate 100 disposed therein. The load lock chamber 10 is purged to atmospheric pressure before opening the chamber door 16 for receiving another fresh substrate as illustrated in FIG. 7a, completing a process cycle.

The transfer mechanism 44 does not employ multi-link arms and the transfer arms 46 undergo simple rotational motions on a plane which are easier to generate precisely in a stable manner. The displacements of the transfer arms 46 are relatively small. The simple rotational movements of the transfer arms 46 avoid problems with vibrations and instabilities associated with multi-link mechanisms. As a result, the transfer arms 46 can be moved more quickly and the transfer of the substrates requires less time, thereby increasing throughput. The simple, small displacements of the transfer arms 46 also provide precise positioning and/or centering of the substrates. In addition, the transfer mechanism 44 does not require a lot of room to maneuver, so that the load lock chamber 10 is more compact and requires a lower pump down volume, making the load lock apparatus more efficient and effective.

The above-described arrangements of apparatus and methods are merely illustrative of applications of the principles of this invention and many other embodiments and modifications may be made without departing from the spirit and scope of the invention as defined in the claims. For instance, the transfer mechanism 44 may include a vertical actuator that provides vertical displacement of the transfer arms 46. There may be fewer or more stations provided on the transfer elevator 20 for storing fewer or more wafers. The load lock apparatus may include multiple process stations 22 (e.g., two additional stations) disposed around the yoke 50 of the transfer mechanism 44 so that multiple processes can be carried out simultaneously within a single load lock chamber 10.

What is claimed is:

1. A substrate handling apparatus comprising:
    a load lock chamber having a port for transferring substrates in and out of the load lock chamber;
    a transfer elevator disposed inside the load lock chamber, the transfer elevator having an upper station with an upper elevator spacing thereabove and a lower station disposed generally below the upper station, the lower station being spaced from the upper station by a lower elevator spacing, the transfer elevator being movable between an up position to generally align the lower station with the port of the load lock chamber and a down position to generally align the upper station with the port of the load lock chamber;
    a process station disposed inside the load lock chamber, the process station having a first portion and a second portion, at least one of the first portion and the second portion being movable relative to the other of the first portion and the second portion between an open position and a closed position, the first portion and the second portion being coupled with each other in the closed position and being separated from each other in the open position by a process station spacing; and
    a transfer device disposed inside the load lock chamber, the transfer device including a pair of transfer arms which define an open space therebetween and are movable between the transfer elevator at least partially through one of the upper and lower elevator spacings and the process station at least partially through the process station spacing, the transfer arms being rotatable relative to each other between a support position and a release position, the transfer arms moving toward each other in rotation to decrease the size of the open space therebetween in the support position to contact a substrate to support the substrate and moving apart from each other in rotation to increase the size of the open space therebetween in the release position to release the substrate,
    wherein the open space between the transfer arms is sufficiently large in the release position to allow movement of at least one of the first portion and the second portion of the process station between the open position and the closed position when the process station is disposed in the open space between the pair of transfer arms.

2. The substrate handling apparatus of claim 1 wherein the upper station has an upper support surface for supporting a surface of a substrate and the lower station has a lower support surface for supporting a surface of another substrate, the upper support surface and the lower support surface each being smaller in area than the surface of each substrate.

3. The substrate handling apparatus of claim 1 wherein the open space between the transfer arms is sufficiently large in the release position to allow movement of the transfer elevator between the up and down positions when the transfer elevator is disposed in the open space between the pair of transfer arms.

4. The substrate handling apparatus of claim 1 wherein the pair of transfer arms are movable along a substantially horizontal plane between the transfer elevator and the process station.

5. The substrate handling apparatus of claim 4 wherein the transfer elevator is movable in a substantially vertical direction between the up and down positions and at least one of the first portion and the second portion of the process station is movable in a substantially vertical direction between the open position and the closed position.

6. The substrate handling apparatus of claim 4 wherein the pair of transfer arms are movable relative to each other between the support position and the lease position along the substantially horizontal plane.

7. The substrate handling apparatus of claim 1 wherein the pair of transfer arms are pivotable to rotate relative to an axis of rotation between the transfer elevator at least partially through one of the upper and lower elevator spacings and the process station at least partially through the process station spacing, the pair of transfer arms being pivotable to rotate towards and away from one another relative to the axis of rotation to adjust the size of the open space therebetween.

8. The substrate handling apparatus of claim 1 wherein the pair of transfer arms include curved portions which are disposed generally opposite from each other relative to the open space therebetween.

9. The substrate handling apparatus of claim 1 wherein the pair of transfer arms each include at least one bottom support for contacting and supporting a bottom portion of the substrate.

10. The substrate handling apparatus of claim 1 wherein the pair of transfer arms each include at least one edge contact for contacting an edge portion of the substrate.

11. The substrate handling apparatus of claim 1 wherein the pair of transfer arms comprise a material for contacting the substrate, the material being selected from the group consisting of quartz, sapphire, and ceramics.

12. The substrate handling apparatus of claim 1 further comprising a mechanism for moving the pair of transfer arms between the support position and the release position, the mechanism comprising a first bearing coupled with one of the transfer arms and a second bearing coupled with another of the transfer arms, the first and second bearings biased toward one another to move the pair of transfer arms toward the support position and being movable apart from one another to move the pair of transfer arms toward the release position.

13. The substrate handling apparatus of claim 12 wherein the mechanism comprises at least one movable shaft having a cone-shaped head, the shaft being actuatable to move between the first and second bearings to spread the first and second bearings apart toward the release position with the cone-shaped head and being actuatable to withdraw from the first and second bearings to allow the first and second bearings to return to the support position.

14. The substrate handling apparatus of claim 13 wherein the mechanism comprises a first movable shaft which is disposed to move the first and second bearings between the support position and the release position when the pair of transfer arms are disposed at the process station, and a second movable shaft which is disposed to move the first and second bearings between the support position and the release position when the pair of transfer arms are disposed at the transfer station.

15. The substrate handling apparatus of claim 1 wherein the process station includes a plurality of lift pins which are movable for lifting and lowering the substrate.

16. The substrate handling apparatus of claim 1 wherein the load lock chamber comprises a vacuum chamber.

17. A substrate handling apparatus comprising:
a load lock chamber;
a transfer station disposed inside the load lock chamber;
a process station disposed inside the load lock chamber;
a pair of transfer arms disposed inside the load lock chamber;
means for rotating the pair of transfer arms between the transfer station and the process station substantially along a plane to transfer a substrate between the transfer station and the process station; and
means for moving the pair of transfer arms toward each other substantially along the plane to contact the substrate to support the substrate and moving the pair of transfer arms apart from each other to release the substrate.

18. The substrate handling apparatus of claim 17 wherein the transfer station includes at least one support for supporting the substrate, the at least one support being movable in a generally vertical direction.

19. The substrate handling apparatus of claim 18 wherein the transfer station includes a plurality of supports which are spaced from each other in the generally vertical direction.

20. The substrate handling apparatus of claim 17 wherein the process station comprises an upper portion and a lower portion, at least one of the upper portion and the lower portion being movable relative to the other of the upper portion and the lower portion between an open position and a closed position, the upper portion and the lower portion being coupled with each other in the closed position and being separated from each other in the open position by a process station spacing.

21. The substrate handling apparatus of claim 20 wherein the means for rotating the pair of transfer arms rotates the transfer arms in unison between the transfer station and the process station at least partially through the process station spacing between the upper portion and the lower portion of the process station.

22. The substrate handling apparatus of claim 20 wherein at least one of the upper portion and the lower portion of the process station is movable in a generally vertical direction relative to the other of the upper portion and the lower portion.

23. The substrate handling apparatus of claim 17 wherein the means for rotating the pair of transfer arms rotates the transfer arms along a substantially horizontal plane.

24. The substrate handling apparatus of claim 17 wherein the pair of transfer arms include curved portions which are disposed generally opposite from each other.

25. The substrate handling apparatus of claim 17 wherein the pair of transfer arms each include at least one bottom support for contacting and supporting a bottom portion of the substrate.

26. The substrate handling apparatus of claim 17 wherein the pair of transfer arms each include at least one edge contact for contacting an edge portion of the substrate.

27. A device for transferring a wafer between a transfer station and a process station having a first portion and a second portion which are coupled with each other in a closed position and which are spaced from each other by a process station spacing in an open position, the device comprising:
a pair of transfer arms defining an open space therebetween and being pivotable to rotate in unison between the transfer station and the process station at least partially through the process station spacing between the first and second portions of the process station; and
a mechanism coupling the pair of transfer arms to adjust the size of the open space, the mechanism decreasing the size of the open space to contact the wafer with the pair of transfer arms for supporting the wafer and increasing the size of the open space to release the wafer.

28. The device of claim 27 wherein the mechanism is configured to increases the size of the open space sufficiently to allow movement of at least one of the first portion and the second portion of the process station between the open position and the closed position when the process station is disposed in the open space between the pair of transfer arms.

29. The device of claim 27 wherein the mechanism comprises a first bearing coupled with one of the transfer arms and a second bearing coupled with another of the transfer arms, the first and second bearings biased toward one another to move the pair of transfer arms toward each other to contact the wafer and being movable apart from one another to move the pair of transfer arms apart from each other to release the wafer.

30. The device of claim 29 wherein the mechanism comprises at least one movable shaft having a cone-shaped head, the shaft being actuatable to move between the first and second bearings to spread the first and second bearings apart with the cone-shaped head and being actuatable to withdraw from the first and second bearings to allow the first and second bearings to return toward one another.

31. The device of claim 30 wherein the mechanism comprises a first movable shaft which is disposed to move the first and second bearings apart with the cone-shaped head when the pair of transfer arms are disposed at the process station, and a second movable shaft which is disposed to move the first and second bearings apart with the cone-shaped head when the pair of transfer arms are disposed at the transfer station.

32. The device of claim 27 wherein the pair of transfer arms include curved portions which are disposed generally opposite from each relative to the open space therebetween and which are generally mirror images of one another.

33. The device of claim 27 wherein the pair of transfer arms each include at least one bottom support for contacting and supporting a bottom portion of the substrate.

34. The device of claim 27 wherein the pair of transfer arms each include at least one edge contact for contacting an edge portion of the substrate.

35. A method for transferring substrates for processing in a process station having a first portion and a second portion which are coupled with each other in a closed position and which are spaced from each other in an open position by a process station spacing, the method comprising:
providing a first substrate on a first substrate support of a transfer station;
contacting the first substrate with a pair of transfer arms to support the first substrate between the pair of transfer arms by decreasing the size of an open space between the pair of transfer arms;
separating the first substrate support of the transfer station from the first substrate;
moving the pair of transfer arms together in rotation to the process station to position the first substrate in the process station spacing between the first portion and the second portion;
releasing the first substrate from the pair of transfer arms into the process station by increasing the size of the open space between the pair of transfer arms; and
closing the first portion and the second portion of the process station for processing the first substrate in the process station in the closed position which is disposed in the open space between the pair of transfer arms.

36. The method of claim 35 wherein the step of contacting the first substrate comprises contacting at least one of an edge portion and a bottom portion of the first substrate with each of the pair of transfer arms to support the first substrate between the pair of transfer arms.

37. The method of claim 35 wherein decreasing the size of the open space between the pair of transfer arms comprises moving at least one of the transfer arms toward another one of the transfer arms and increasing the size of the open space between the pair of transfer arms comprises moving at least one of the transfer arms apart from another one of the transfer arms.

38. The method of claim 37 wherein decreasing the size of the open space between the pair of transfer arms comprises rotating at least one of the transfer arms toward another one of the transfer arms and increasing the size of the open space between the pair of transfer arms comprises rotating at least one of the transfer arms apart from another one of the transfer arms.

39. The method of claim 38 wherein the pair of transfer arms are biased toward one another to decrease the size of the open space therebetween, and are movable by a force to increase the size of the open space therebetween.

40. The method of claim 35 wherein the step of separating the first substrate support of the transfer station from the first substrate comprises lowering the first substrate support relative to the first substrate.

41. The method of claim 35 wherein the step of releasing the first substrate into the process station comprises positioning the first substrate on a platen in the process station.

42. The method of claim 41 wherein positioning the first substrate on the platen comprises placing the first substrate on a plurality of lift pins extending above the platen and lowering the lift pins to lower the first substrate onto the platen.

43. The method of claim 35 wherein the pair of transfer arms are moved substantially along a plane between the transfer station and the process station.

44. The method of claim 43 wherein the pair of transfer arms are moved substantially along a horizontal plane between the transfer station and the process station.

45. The method of claim 43 wherein the size of the open space between the pair of transfer arms is decreased by moving at least one of the pair of transfer arms toward another one of the pair of transfer arms substantially along the plane, and the size of the open space between the pair of transfer arms is increased by moving at least one of the pair of transfer arms apart from another one of the pair of transfer arms substantially along the plane.

46. The method of claim 45 wherein the size of the open space between the pair of transfer arms is adjusted by rotating at least one of the pair of transfer arms relative to another one of the pair of transfer arms.

47. The method of claim 35 further comprising opening the first portion and the second portion of the process station to the open position with the first substrate disposed in the process station spacing therebetween; contacting the first substrate with the pair of transfer arms to support the first substrate between the pair of transfer arms by decreasing the size of the open space between the pair of transfer arms; and moving the pair of transfer arms from the process station to transfer the first substrate from the process station spacing to the transfer station.

48. The method of claim 47 further comprising moving a second substrate support of the transfer station upward to contact the bottom surface of the first substrate and releasing the first substrate from the pair of transfer arms.

49. The method of claim 48 wherein the second substrate support is provided generally above the first substrate support in the transfer station.

50. The method of claim 48 wherein the step of placing the first substrate on the second substrate support of the transfer station comprises moving the second substrate support to contact a bottom of the first substrate from below.

51. The method of claim 47 further comprising providing a second substrate on the first substrate support of the transfer station.

52. The method of claim 51 further comprising contacting the second substrate with the pair of transfer arms to support the second substrate between the pair of transfer arms by decreasing the size of the open space between the pair of transfer arms; separating the first substrate support of the transfer station from the second substrate; moving the pair of transfer arms to the process station to position the second substrate in the process station spacing between the first portion and the second portion; releasing the second substrate from the pair of transfer arms into the process station by increasing the size of the open space between the pair of transfer arms; and closing the first portion and the second portion of the process station for processing the second substrate in the process station in the closed position which is in the open space between the pair of transfer arms.

53. The method of claim 52 further comprising removing the first substrate from the second substrate support of the transfer station.

54. The method of claim 35 wherein the transfer station, the process station, and the pair of transfer arms are provided inside a load lock chamber, and the step of providing the first substrate on the first substrate support of the transfer station comprises opening a port of the load lock chamber and transferring the first substrate through the port.

55. The substrate handling apparatus of claim 17 wherein the means for moving the pair of transfer arms rotates the pair of transfer arms toward each other along the plane to contact the substrate to support the substrate and rotates the pair of transfer arms apart from each other to release the substrate.

56. The substrate handling apparatus of claim 55 wherein the pair of transfer arms are rotated toward and apart from each other relative to an axis of rotation, and wherein the means for rotating the pair of transfer arms rotate the transfer arms relative to the axis of rotation between the transfer station and the process station.

57. The device of claim 27 wherein the mechanism is configured to rotate the pair of transfer arms relative to one another to adjust the size of the open space therebetween.

58. The device of claim 57 wherein the pair of transfer arms are pivotable to rotate in unison relative to an axis of rotation between the transfer station and the process station, and wherein the mechanism is configured to rotate the pair of transfer arms relative to the axis of rotation to adjust the size of the open space therebetween.

59. The method of claim 38 wherein the size of the open space between the pair of transfer arms is increased or decreased by rotating at least one of the transfer arms relative to an axis of rotation, and wherein the pair of transfer arms are moved together in rotation relative to the axis of rotation to the process station to position the first substrate in the process station spacing between the first portion and the second portion.

* * * * *